(12) United States Patent
Tai et al.

(10) Patent No.: US 6,976,850 B2
(45) Date of Patent: Dec. 20, 2005

(54) CONNECTOR

(75) Inventors: Tomishige Tai, Tokyo (JP); Seiya Takahashi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 10/515,099

(22) PCT Filed: Mar. 16, 2004

(86) PCT No.: PCT/JP2004/003477

§ 371 (c)(1),
(2), (4) Date: Nov. 19, 2004

(87) PCT Pub. No.: WO2004/084354

PCT Pub. Date: Sep. 30, 2004

(65) Prior Publication Data

US 2005/0202691 A1    Sep. 15, 2005

(30) Foreign Application Priority Data

Mar. 20, 2003  (JP) ............................ 2003-078338

(51) Int. Cl.[7] ............................................ H01R 12/00
(52) U.S. Cl. ........................................ 439/66; 439/91
(58) Field of Search ............................ 439/66, 91, 591

(56) References Cited

U.S. PATENT DOCUMENTS 5,462,440 A * 10/1995 Rothenberger ............... 439/66
6,205,660 B1 * 3/2001 Fjelstad et al. ............... 29/885
6,293,808 B1 * 9/2001 Ochiai ........................ 439/70
6,374,487 B1 * 4/2002 Haba et al. .................. 29/840
2004/0253846 A1 * 12/2004 Brown et al. ................. 439/66

FOREIGN PATENT DOCUMENTS

| JP | 52 99 796 | 11/1993 |
|---|---|---|
| JP | 2549125 | 9/1997 |
| JP | 9-259998 | 10/1997 |
| JP | 9-275251 | 10/1997 |
| JP | 9-283897 | 10/1997 |
| JP | 2002 075489 | 3/2002 |
| JP | 2002 298950 | 10/2002 |

* cited by examiner

*Primary Examiner*—Tho D. Ta
*Assistant Examiner*—James R. Harvey
(74) *Attorney, Agent, or Firm*—Collard & Roe, P.C.

(57) ABSTRACT

A connector provides electrical connection between an object (21) to be connected having contact portions (23) and a mating connection object (31) having mating contact portions (33). The connection is achieved when the connector is in contact with the contact portions (23) and the mating contact portions (33). The connector has a base member (11), elastic members (13) provided on the base member, electrically conductive patterns (15a, 15b) arranged on the base member so as to provide electrical connection between the front and back surfaces of the base member, and terminals (17) arranged on the elastic members (13) so as to be in contact with the contact portions (23) and the mating contact portions (33). The terminals (17) and the conductive patterns (15a, 15b) are connected to each other. Those portions of the base member (11) where either elastic members (13) or conductive patterns are provided are shaped in a mesh-like form.

2 Claims, 1 Drawing Sheet

CONNECTOR

CROSS REFERENCE TO RELATED APPLICATIONS

Applicants claim priority under 35 U.S.C. §119 of JAPANESE Application No. JP2003/78338 filed on Mar. 20, 2003. Applicants also claim priority under 35 U.S.C. §365 of PCT/JP2004/003447 filed on Mar. 16, 2004. The international application under PCT article 21(2) was not published in English.

TECHNICAL FIELD

This invention relates to a connector interposed between a connection object having a contact portion and a mating connection object having a mating contact portion and brought into contact with the contact portion and the mating contact portion to connect the connection object and the mating connection object so as to establish electrical connection therebetween.

BACKGROUND ART

As a conventional connector, there is known a connector in which an insulating resin layer is filled between an inner peripheral surface of a through hole formed in a conductive film and a spherical contact comprising a deformable spherical body having a conductive coating formed on its surface so that the spherical contact is held by the conductive film [for example, see Japanese Utility Model Registration (JP-Y) No. 2549125 (Patent Document 1)].

There is also known an anisotropic conductive sheet comprising a plurality of conductors each of which has a hollow three-dimensional structure formed by a thin film and penetrates an insulating sheet to expose upper and lower opposite ends thereof and which are distributed on the insulating material sheet [for example, see Japanese Patent Application Publication (JP-A) No. 2002-75489 (Patent Document 2)].

Further, there is known a printed wiring board comprising a spreading conductor pattern provided with a number of weight reduction holes regularly formed so as to obtain a meshed conductor pattern [for example, see Japanese Patent Application Publication (JP-A) No. H9-275251 (Reference Document 3)].

Also, there are known an adhesive sheet comprising a sheet impregnated with a thermosetting resin, and a metal clad laminate plate comprising the adhesive sheet with a metal conductor layer laminated on opposite surfaces or one surface thereof [for example, see Japanese Patent Application Publication (JP-A) No. H5-299796 (Reference Document 4)].

Furthermore, there is known a bonding method of bonding a conductive substrate such as a printed board and a multi-contact element such as an LSI by forming a printed conductive sheet comprising a mesh sheet or a porous sheet having a plurality of conductive patterns providing electrical connection between opposite surfaces thereof and corresponding to a conductive pattern of the conductive substrate, arranging the printed conductive sheet between the conductive substrate and the multi-contact element such as the LSI, and integrally coupling and electrically connecting the conductive pattern of the conductive substrate and the conductive pattern of the LSI or the like [for example, see Japanese Patent Application Publication (JP-A) No. H9-283897 (Reference Document 5)].

However, in Patent Documents 1 and 2, the volume of the film (sheet) itself is changed. Therefore, when the film is disposed between a substrate and an electronic device, it is impossible to compensate for the coplanarity of the substrate and the electronic device. In addition, the film (sheet) must be very thick.

Further, rigid metals are connected to each other as contacts. Therefore, mutual contact is unstable unless a large load is applied.

In References 3 and 4, use is made of the mesh sheet embedded in a multilayer substrate. Thus, the mesh sheet itself is not an electrical member which not only serves as a circuit board but also realizes a function as a contact member.

In Reference 5, the mesh sheet is provided with the pattern and the mesh sheet itself is used as an elastic member. Therefore, the amount of deformation is limited.

It is therefore an object of this invention to provide a connector assuring sufficient contact or adhesion to achieve stable contact.

DISCLOSURE OF THE INVENTION

According to this invention, there is provided a connector which is interposed between a connection object having a plurality of contact portions and a mating connection object having a plurality of mating contact portions and which is brought into contact with the contact portions and the mating contact portions to connect the connection object and the mating connection object so as to establish electrical conduction therebetween, wherein the connector comprises an insulating base member having a sheet-like shape, a plurality of elastic members protruding on opposite surfaces of the base member, a plurality of conductive patterns formed on the opposite surfaces of the base member and providing electrical connection between the opposite surfaces of the base member, and a terminal as a thin film conductor formed on at least one of the elastic members to be brought into contact with a corresponding one of the contact portions and a corresponding one of the mating contact portions which are to be connected, the terminal and a corresponding one of the conductive patterns being connected to each other, the base member having a meshed portion in an area where at least either of the elastic members and the conductive patterns are formed.

According to this invention, there is also provided the connector wherein each of the elastic members is made of an adhesive material.

BEST MODE FOR EMBODYING THE INVENTION

Figure 1:
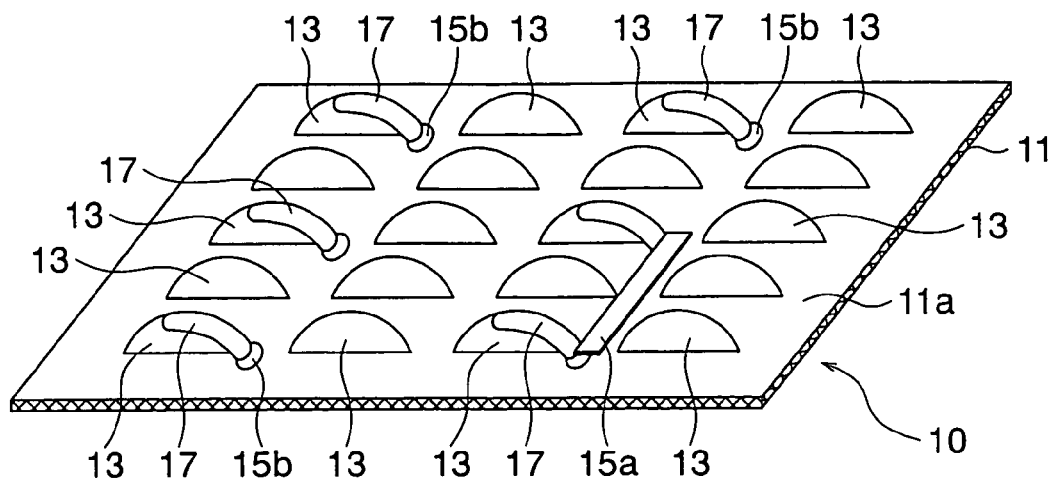
FIG. 1 is a perspective view of a connector according to one embodiment of this invention.
Figure 2:
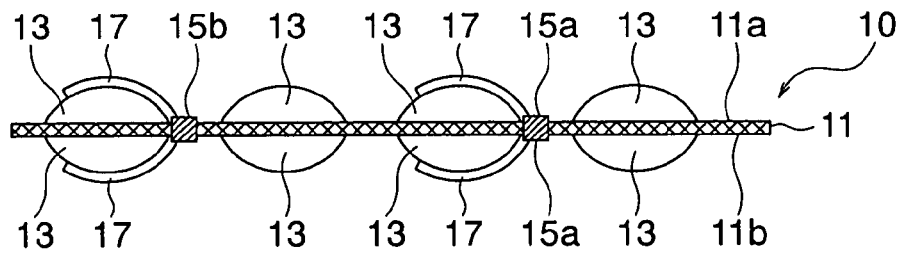
FIG. 2 is a front view of the connector illustrated in FIG. 1.

Hereinafter, description will be made of a connector according to one embodiment of this invention. FIGS. 1 and 2 show the connector according to the one embodiment.

Referring to FIGS. 1 and 2, the connector 10 comprises an insulating base member 11, a plurality of elastic members 13 disposed on upper and lower surfaces 11a and 11b of the base member 11 to protrude on the upper and the lower surfaces 11a and 11b, a plurality of conductive patterns 15a and 15b disposed on the upper and the lower surfaces 11a and 11b of the base member 11, and a plurality of terminals 17 formed on the elastic members 13.

The base member 11 is a sheet having a mesh-like structure. Each of the elastic members 13 is made of an adhesive material. The elastic members 13 are electrically connected between the upper and the lower surfaces 11a and 11b of the base member 11 and are arranged in a matrix fashion at predetermined intervals from one another on the upper and the lower surfaces 11a and 11b of the base member 11.

The elastic members 13 formed on the upper surface 11a of the base member 11 and the elastic members 13 formed on the lower surface 11b of the base member 11 are faced to each other via the base member 11 as a boundary. Each of the terminals 17 is a thin-film conductor. The terminals 17 and the conductive patterns 15 are connected to each other.

Figure 3:
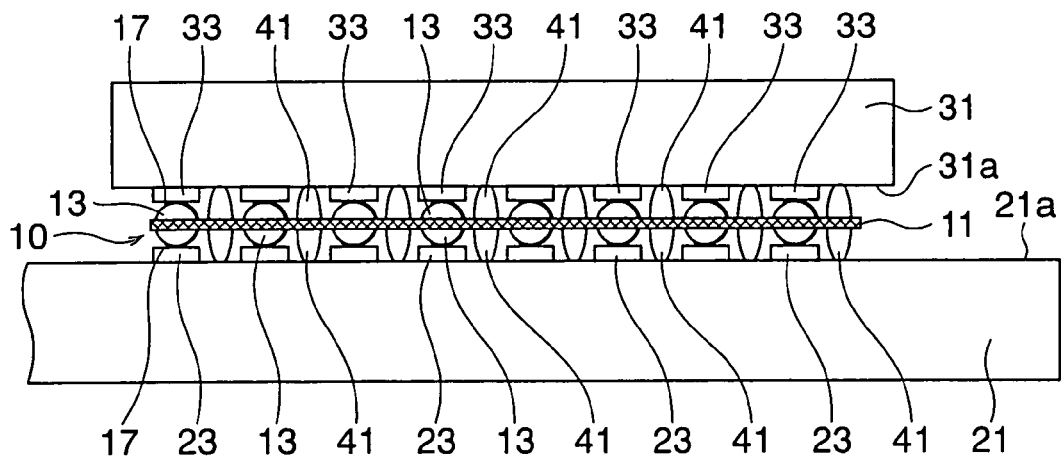
FIG. 3 is a front view of the connector illustrated in FIG. 1 when the connector is interposed between a substrate and an electronic device.

FIG. 3 shows the connector 10, a connection object connected to the connector 10, and a mating connection object connected to the connection object through the connector 10. In the following description, the connection object is replaced by a board such as a printed circuit board. In the following description, the mating connection object is replaced by an electronic device.

Referring to FIG. 3, a substrate 21 has one surface 21a provided with a plurality of contact portions 23. The contact portions 23 are equal in number to the elastic members 13 and disposed on the one surface 21a of the substrate 21 in a matrix fashion at predetermined intervals. An electronic device 31 has one surface 31a provided with a plurality of mating contact portions 33 equal in number to the elastic members 13. The mating contact portions 33 are disposed on the one surface 31a of the electronic device 31 in a matrix fashion at predetermined intervals.

The contact portions 23 are faced to the elastic members 13 formed on the lower surface 11b of the base member 11 in one-to-one correspondence. The terminals 17 formed on the elastic members 13 are brought into direct contact with the contact portions 23 to be electrically connected thereto. The elastic members 13 without the terminals 17 are brought into direct contact with the contact portions 23.

The mating contact portions 33 are faced to the elastic members 13 formed on the upper surface 11a of the base member 11 in one-to-one correspondence. The terminals 17 of the elastic members 13 are brought into direct contact with the mating contact portions 33 to be electrically connected thereto. The elastic members 13 without the terminals 17 are brought into direct contact with the mating contact portions 33.

The substrate 21 is fixed to an apparatus which is not shown. When the electronic device 31 is held by the substrate 21 through the connector 10, the substrate 21 and the electronic device 31 are connected in the state where the elastic members 13 are slightly compressed between the electronic device 31 and the substrate 21.

Between the substrate 21 and the base member 11 and between the base member 11 and the electronic device 31, a plurality of spacer members 41 are interposed. The spacer members 41 serve to keep a predetermined distance between the substrate 21 and the electronic device 31 in order to prevent excessive elastic deformation of the elastic members 13.

As described above, in the connector 10, the elastic members 13 for connection between the substrate 21 and the electronic device 31 are provided with the terminals 17. With this structure, the contact portions 23 and the mating contact portions 33 are electrically connected via the terminals 17 connected to the conductive patterns 15a and 15b.

In the foregoing embodiment, a whole of the base member 11 is formed by the use of the sheet having a mesh-like structure. Alternatively, only a part of the base member 11 where the elastic members 13 are disposed may have a mesh-like structure.

Alternatively, only a part of the base member 11 where the conductive patterns 15a and 15b are disposed may have a mesh-like structure.

Each of the elastic members 13 having an adhesiveness may comprise one of a gel-like material, a thermoplastic resin material, and a thermosetting resin material. Specifically, in case where one of the gel-like material, the thermoplastic resin material, and the thermosetting resin material is used as the elastic members 13 having an adhesiveness, the gel-like material, the thermoplastic resin material, or the thermosetting resin material without the terminals 17 is adhered to the contact portions 23 and the mating contact portions 33 so as to hold the substrate 21 and the electronic device 31.

If the thermoplastic resin material or the thermosetting resin material is used, the elastic members 13 are heated and thereby held on the contact portions 23 and the mating contact portions 33.

As described above, in the connector according to this invention, the base member is provided with the elastic members. Each of the elastic members to be connected to the metal pattern on the base member is provided with the terminal portion and the terminal portion is connected to the metal pattern. Deformation of the elastic members causes the displacement of the elastic members. Therefore, sufficient contact is assured with the thickness substantially equivalent to the coplanarity of the substrate and the electronic device.

The terminal portions are pressed by the elastic members to assure sufficient tight contact with the contact portions and the mating contact portions. As compared with the prior art, contact is stable under a contact load smaller by two digits.

We claim:

1. A connector which is interposed between a connection object having a plurality of contact portions and a mating connection object having a plurality of mating contact portions and which is brought into contact with the contact portions and the mating contact portions to connect the connection object and the mating connection object so as to establish electrical conduction therebetween, wherein the connector comprises an insulating base member having a sheet-like shape, a plurality of elastic members protruding on opposite surfaces of the base member, a plurality of conductive patterns formed on the opposite surfaces of the base member and providing electrical connection between the opposite surfaces of the base member, and a terminal as a thin film conductor formed on at least one of the elastic members to be brought into contact with a corresponding one of the contact portions and a corresponding one of the mating contact portions which are to be connected, the terminal and a corresponding one of the conductive patterns being connected to each other, the base member having a meshed portion in an area where at least either of the elastic members and the conductive patterns are formed.

2. The connector according to claim 1, wherein each of the elastic members is made of an adhesive material.

* * * * *